United States Patent [19]

Khan et al.

[11] Patent Number: 5,296,395
[45] Date of Patent: Mar. 22, 1994

[54] METHOD OF MAKING A HIGH ELECTRON MOBILITY TRANSISTOR

[75] Inventors: Muhammad A. Khan, White Bear Lake; James M. VanHove, Eagan; Jon N. Kuznia, Fridley; Donald T. Olson, Circle Pines, all of Minn.

[73] Assignee: APA Optics, Inc., Blaine, Minn.

[21] Appl. No.: 26,528

[22] Filed: Mar. 3, 1993

Related U.S. Application Data

[62] Division of Ser. No. 701,792, May 17, 1991, Pat. No. 5,192,987.

[51] Int. Cl.$^5$ .......................................... H01L 21/265
[52] U.S. Cl. ....................... 437/40; 437/184; 437/912; 148/DIG. 72; 148/DIG. 113
[58] Field of Search ................. 437/40, 184, 133, 176, 437/912, 107; 148/DIG. 113, DIG. 65, DIG. 72, DIG. 160

[56] References Cited

U.S. PATENT DOCUMENTS

| Re. 33,671 | 8/1991 | Dingle et al. | 148/DIG. 160 |
|---|---|---|---|
| 4,268,842 | 5/1981 | Jacob et al. | 148/DIG. 113 |
| 4,614,961 | 9/1986 | Khan et al. | |
| 4,616,248 | 10/1986 | Khan et al. | |
| 4,759,024 | 7/1988 | Hayakawa et al. | |
| 4,855,249 | 8/1989 | Akasaki et al. | 148/DIG. 72 |
| 4,903,088 | 2/1990 | Van Opdorp | |
| 5,076,860 | 12/1991 | Ohba et al. | 148/DIG. 113 |
| 5,147,817 | 9/1992 | Frazier et al. | 437/107 |
| 5,201,051 | 5/1993 | Carter, Jr. | 437/126 |

FOREIGN PATENT DOCUMENTS

| 61-18184 | 1/1986 | Japan . |
|---|---|---|
| 63-188938 | 8/1988 | Japan . |
| 1-278026 | 11/1989 | Japan . |
| 2-81484 | 3/1990 | Japan . |
| 2-229476 | 9/1990 | Japan . |

OTHER PUBLICATIONS

Khan et al; "Electrical Properties and ion implantation of epitaxial GaN, grown by LPMOCVD", Appl. Phys. Lett., vol. 42, pp. 430–432; Mar. 1983.

Amano et al; "Stimulated Emission Near Ultraviolet at Room Temp. from a GaN film Grown on Sapphire by MOVPE Using an AlN."

Buffer layer; Jap. Jour. of Appl. Phys., 29(2), L205-6, Feb. 1990.

Ilegems et al; Electrical Properties of n-Type Vapor Grown GaN, J. Phys. Chem. Solids, vol. 34, pp. 885–895, 1973.

S. Yoshida et al., J. Appl. Phys. vol. 53, p. 6844, 1982.
S. Hiyamizu, Appl. Phys. Lett., vol. 37, p. 805, 1980.
M. Gershenzon et al., 1981 International Optoelectronics Workshop, National Chang Kung University, Tinan Tai Wan, p. 55 (Dec. 1981).

*Primary Examiner*—Brian Hearn
*Assistant Examiner*—Michael Trinh
*Attorney, Agent, or Firm*—Merchant, Gould, Smith, Edell, Welter & Schmidt

[57] ABSTRACT

A high electron mobility transistor is disclosed, which takes advantage of the increased mobility due to a two dimensional electron gas occurring in $GaN/Al_xGa_{1-x}N$ heterojunctions. These structures are deposited on basal plane sapphire using low pressure metalorganic chemical vapor deposition. The electron mobility of the heterojunction is approximately 620 cm$^2$ per volt second at room temperature as compared to 56 cm$^2$ per volt second for bulk GaN of the same thickness deposited under identical conditions. The mobility of the bulk sample peaked at 62 cm$^2$ per volt second at 180° K. and decreased to 19 cm$^2$ per volt second at 77° K. The mobility for the heterostructure, however, increased to a value of 1,600 cm$^2$ per volt second at 77° K. and saturated at 4° K.

4 Claims, 5 Drawing Sheets

FIG. 2
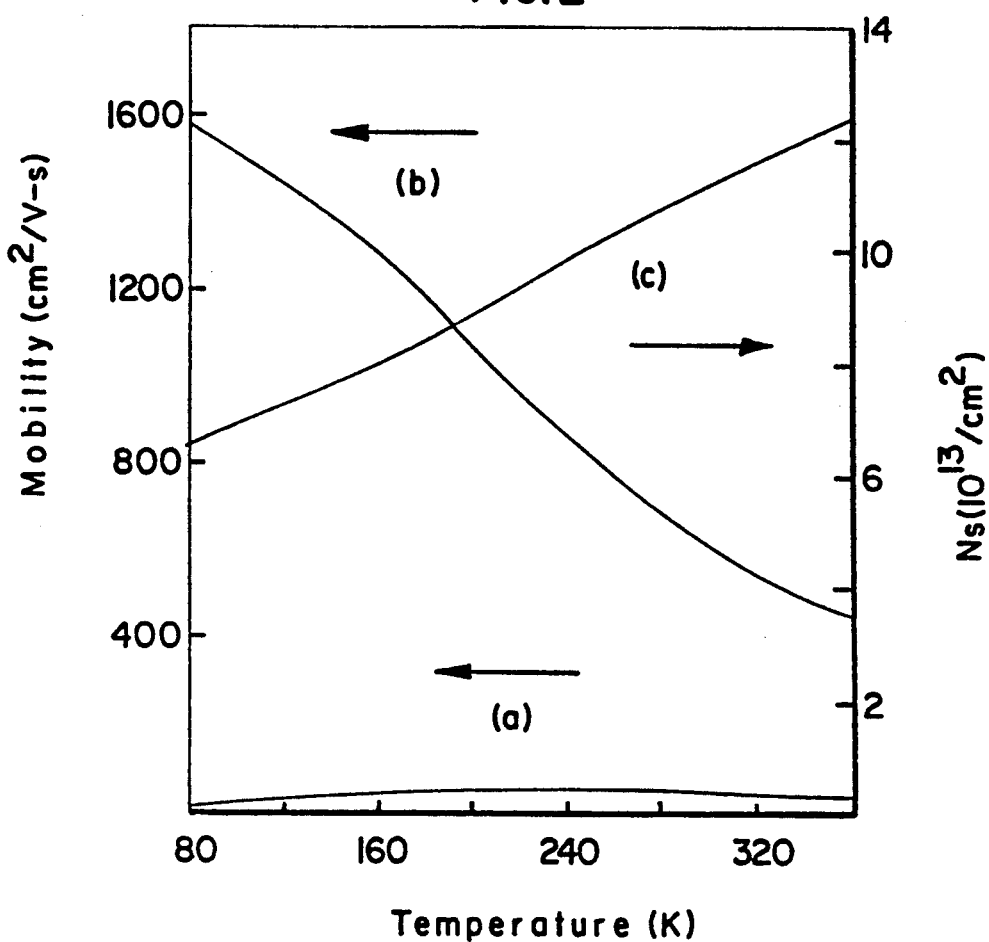
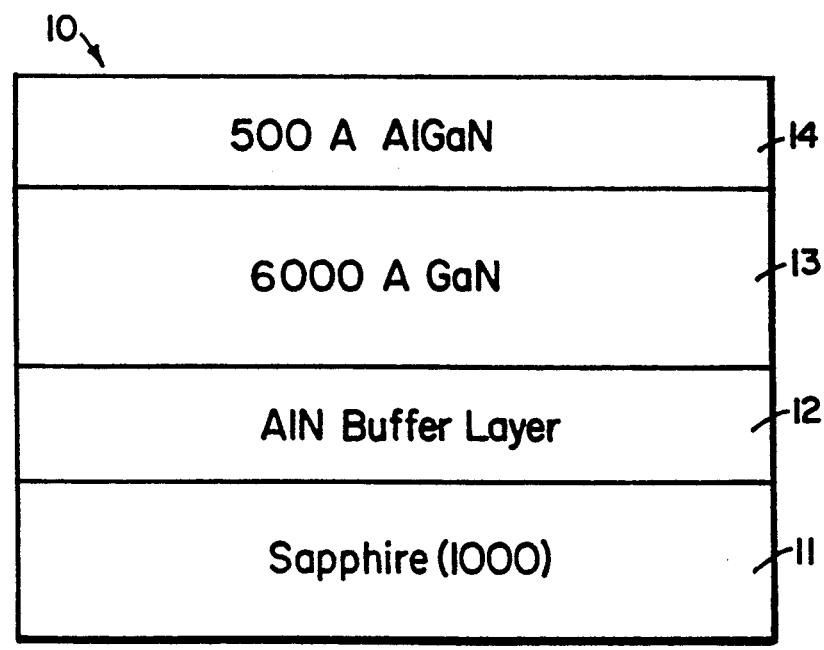
FIG. 3a

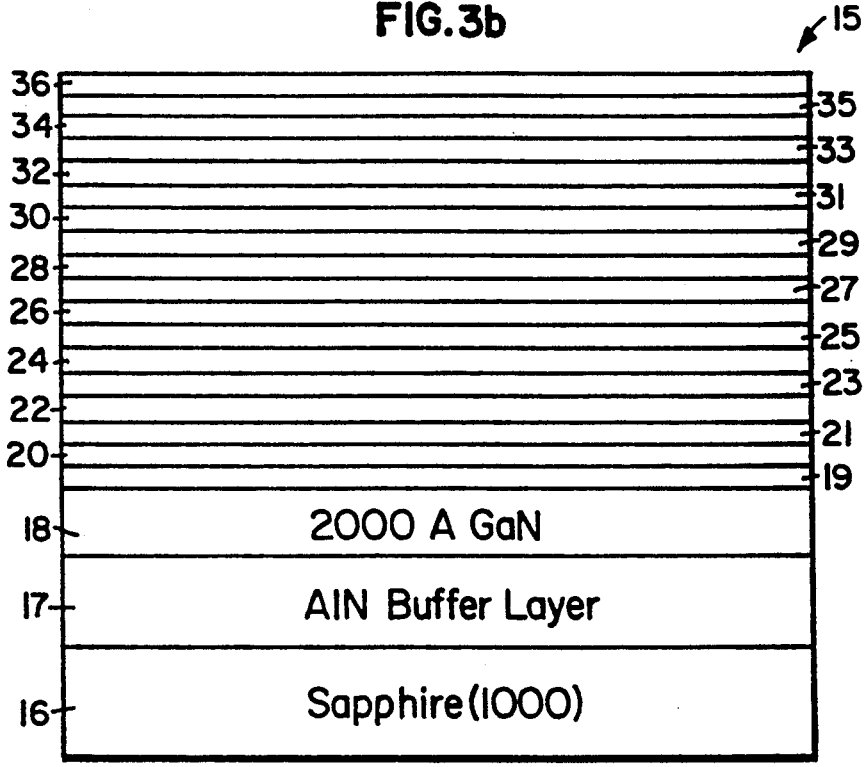
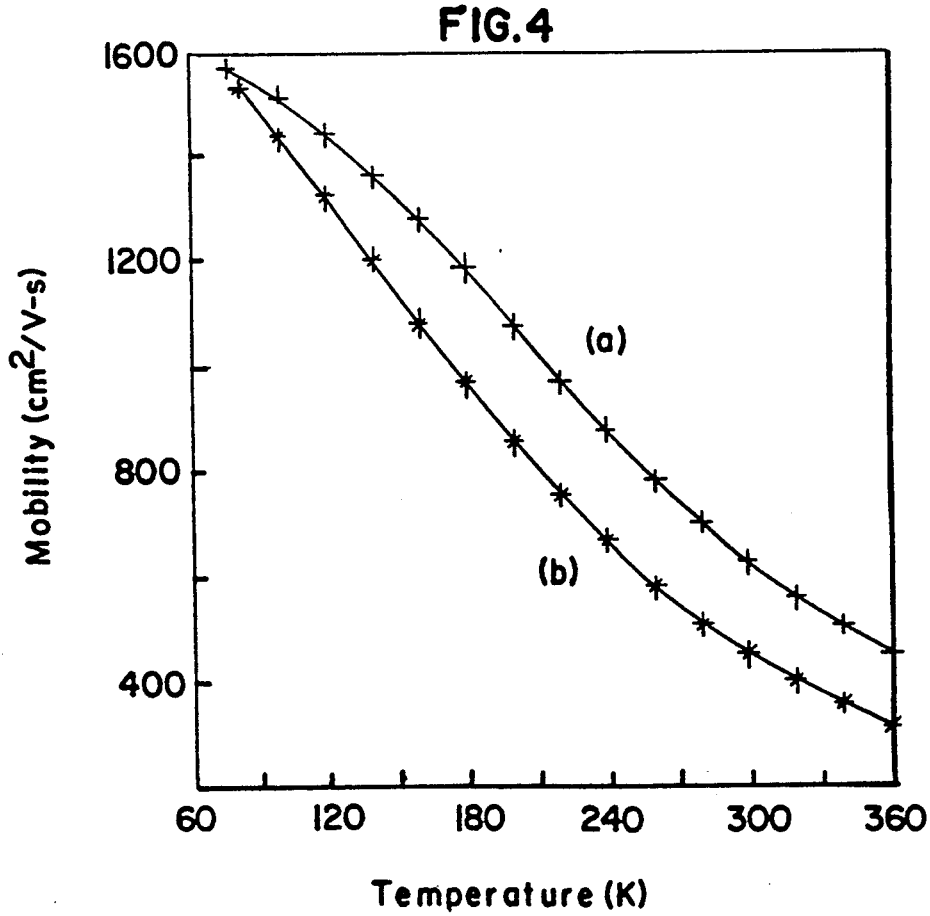

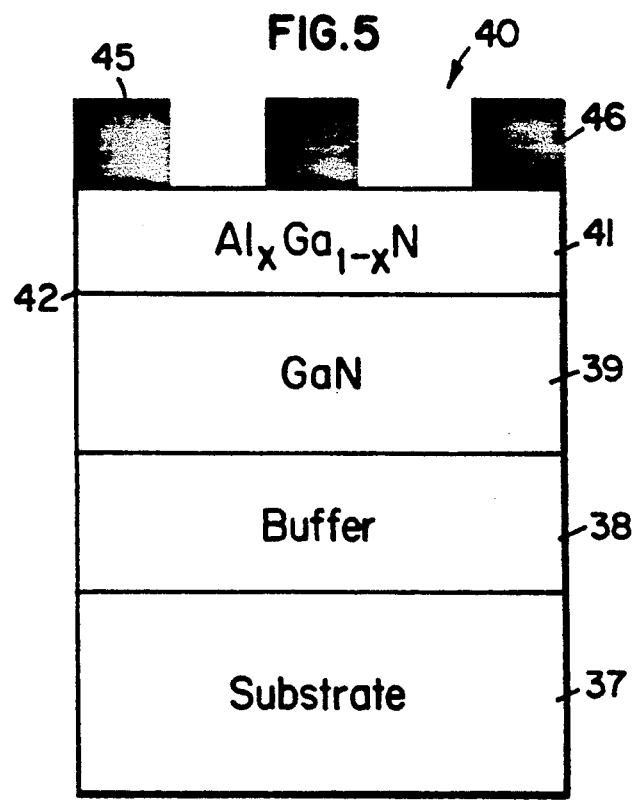
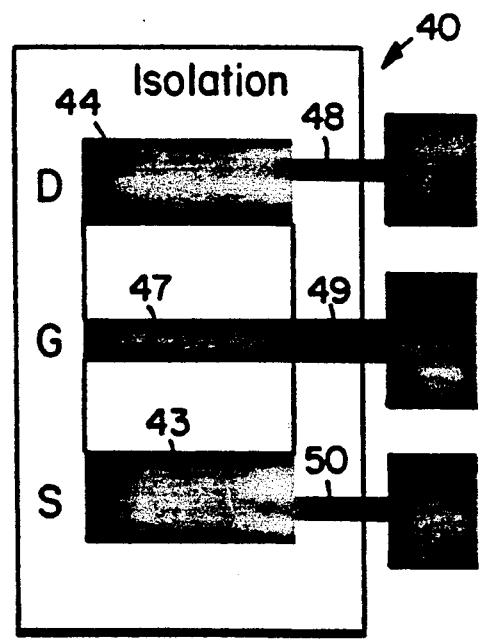

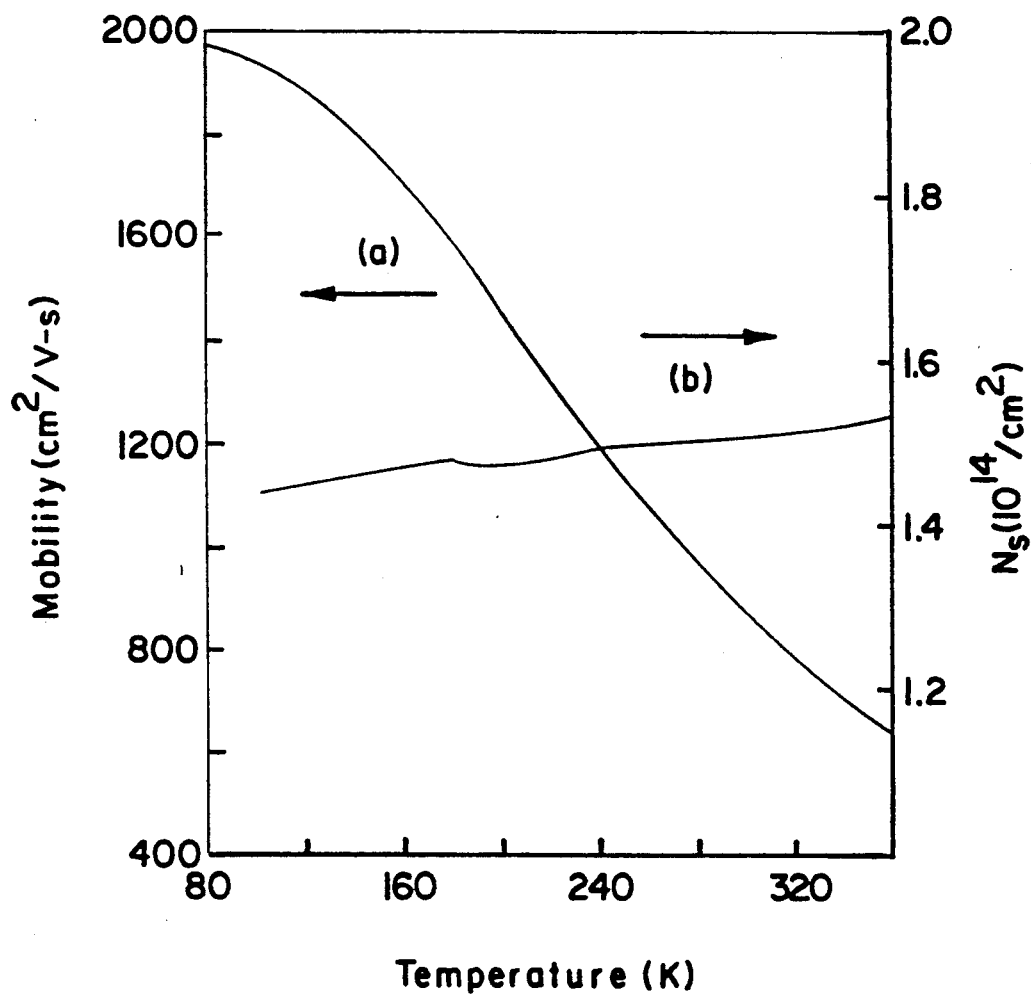

METHOD OF MAKING A HIGH ELECTRON MOBILITY TRANSISTOR

This is a division, of application Ser. No. 07/701,792, filed May 17, 1991, U.S. Pat. No. 5,192,987.

BACKGROUND OF THE INVENTION

I. Field of the Invention

This invention relates to a semiconductor device having improved electron mobility, and in particular, to a transistor constructed of GaN/Al$_x$Ga$_{1-x}$N heterostructures that is capable of operating at temperatures greater than 100° C.

II. Description of Related Technology

Al$_x$Ga$_{1-x}$N is a 3-5 semiconductor system with a direct bandgap ranging from 360 nanometers at x=0 to 200 nanometers at x=1. As reported by M. Gershenzon, D. E. Wang and L. Ta, in the proceedings of the 1981 International Opto Electronic's Workshop, National Chang Kung University, Tinan Tai Wan, Page 55 (December 1981), the Al$_x$Ga$_{1-x}$N material has potential uses in ultraviolet light emitting diodes and detectors, short wave length lasers and transit time limited microwave power amplifiers.

Highly uniform epitaxial films of the materials have been grown by reactive molecular beam epitaxy (as reported by S. Yoshida, S. Gonda, and S. Misawa, and the Journal of Applied Physics, Vol. 53, Page 6,844, 1982), as well as by vapor phase epitaxy (as reported by M. Ilegems, and H. C. Montgomery, Journal of Physical Chemistry Solids, Vol. 34, Page 885, 1973) and by atmospheric and low pressure metal organic chemical vapor deposition (See M. A. Khan, R. A. Skogman, R. G. Schulze, and M. Gershenzon, Applied Physics Letters, Vol. 42, Page 430, 1983 and H. Amano, T. Asahi, and I. Akasaki, Japanese Journal of Applied Physics Letters, Vol. 29, Page L205, 1990).

However, these materials are generally unsuited for semiconductor device applications, because the materials produced are highly degenerate N-type (N$_d$=10$^{18}$ to 10$^{20}$ per cubic centimeter) and the carrier mobilities are relatively low, typically less than 100 cm$^2$ per volt second. Researchers generally concluded that the undesirably high carrier densities were caused by nitrogen vacancies formed during the material growth process.

High electron mobility to transistor have been produced in the past from a GaAs/Al$_x$Ga$_{1-x}$As material as reported by S. Hiyamizu, T. Mimura, T. Fuji and K. Nanbu, Applied Physics Letters, Vol. 37, Page 805, 1980. Although this material exhibits superior electron mobilities, it suffers from instability at high temperatures.

SUMMARY OF THE INVENTION

The present invention is a high electron mobility transistor device structure based on the GaN/Al$_x$Ga$_{1-x}$N material system. Al$_x$Ga$_{1-x}$N has a bandgap approximately four times greater than Al$_x$Ga$_{1-x}$As material, thereby making transistors constructed according to the present invention superior and having a lower noise current as the temperature of operation is increased as compared with the gallium arsenide base transistor. GaN is stable in air to 800° C. and recently we have demonstrated point contact diodes which operate at temperature in excess of 700° C.

The transistor of the present invention is deposited on an aluminum nitride coated substrate material. The channel regions are formed of a 500 to 2,00 angstrom thick layer of GaN, which is then coated with an Al$_x$Ga$_{1-x}$N layer of approximately 500 angstroms in thickness.

Photomasking is used to define the source and drain contact pads, to which an ohmic metal contact is deposited.

A shottky barrier is then deposited using thin metal layers in the region between the source and drain contacts. Electrical connecting wires are then bonded to the ohmic and shottky contacts.

BRIEF DESCRIPTION OF THE DRAWINGS

FIG. 2 is a graph showing mobility and sheet concentration versus temperature for materials related to a transistor constructed according to the principles of the present invention;

FIG. 3a is a depiction of a third layered structure of a transistor constructed according to the principles of the present invention;

FIG. 3b is a depiction of an eighteen period AlGaN/GaN heterojunction;

FIG. 4 is a mobility versus temperature graph for (a) a single AlGaN/GaN heterojunction with a 3000Å GaN layer and (b) a single AlGaN/GaN heterojunction with a 6000Å GaN layer;

FIG. 5 is a schematic side elevation of a transistor constructed in accordance with the principles of the present invention;

FIG. 6 is a schematic plan view of the transistor of FIG. 5; and

FIG. 7 is a graph of (a) electron mobility and (b) sheet carrier concentration versus temperature for a transistor as depicted in FIG. 3b.

DETAILED DESCRIPTION OF THE PREFERRED EMBODIMENTS

Figure 1A:
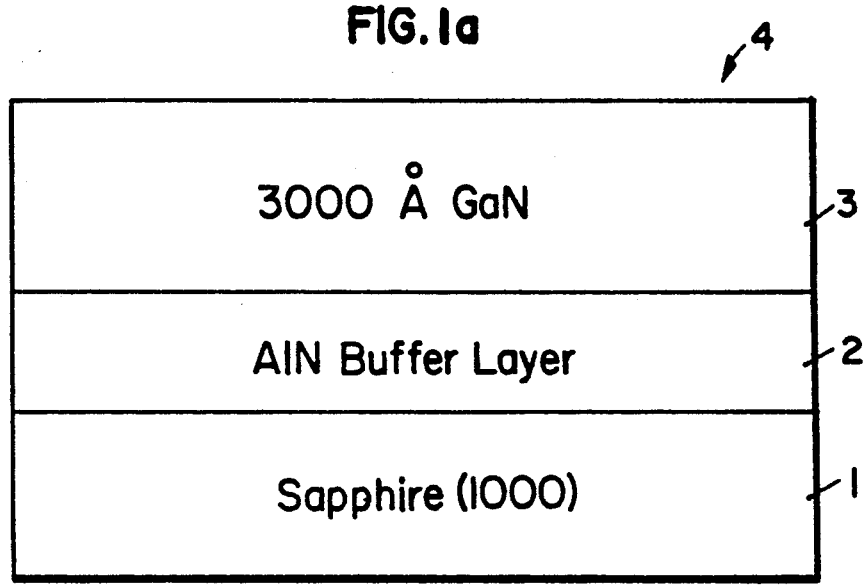
FIG. 1a depicts a first layered structure grown by low pressure metal oxide chemical vapor deposition.

Referring to FIG. 1a, a standard GaN deposition is shown. A substrate 1 is typically used as a base, and in this example was made of basal plane sapphire having a thickness of approximately 350 microns. Deposited on sapphire substrate 1 is an aluminum nitride buffer layer 2, which reduces the lattice, mismatch between the GaN and the sapphire substrate. Finally, a GaN layer 3 having, for example, a thickness of 3,000 angstroms, is deposited.

For the GaN layer just described, the electron mobility is approximately 56 cm$^2$ per volt second and has a carrier density, N$_d$ of approximately 9.6×10$^{17}$ per cubic centimeter. In general, the carrier, or electron, mobility will improve to around 300 cm$^2$ per volt second as the growth thickness is increased to approximately 1.5 microns. This is probably due to the reduction of dislocations as one moves away from the GaN/AlN interface.

Referring to curve (a) of FIG. 2, the deposited device 4 of FIG. 1 is seen to reach its electron mobility peak of approximately 60 cm$^2$ per volt second at a temperature of approximately 180° K. with the electron mobility gradually decreasing as temperature decreases. This particular peaking behavior is typical in high quality GaN gross and is attributable to the polar optical mode and the ionized impurity scattering regimes.

Figure 1B:
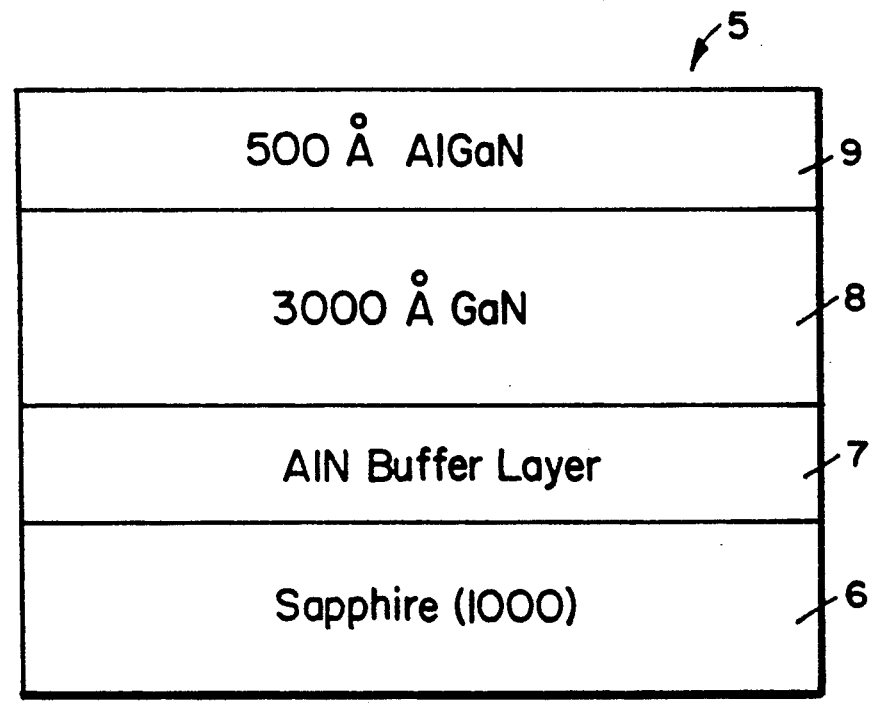
FIG. 1b depicts a second layered structure including a single AlGaN/GaN heterojunction.

Referring to FIG. 1b, a heterojunction 5 depicting layering typical of a high mobility transistor constructed according to the principles of the present invention as shown. As in FIG. 1a, the substrate 6 is constructed of basal plane sapphire substrate having, for example, a thickness of approximately 350 microns. A thin aluminum nitride buffer layer 7, having a thickness of approximately 50 angstroms, is deposited onto substrate 6. Again as in FIG. 1b, the next layer 8 is composed primarily of GaN and has a thickness of approximately 3,000 angstroms. Finally, an $Al_xGa_{1-x}N$ is deposited, having a thickness of approximately 500 angstroms. The characteristics of this heterojunction are depicted in FIG. 4 at curve (a).

Referring again to curve (b) of FIG. 2, the electron mobility of sample 5 is seen to have increased to 620 cm² per volt second at room temperature to 1,600 cm² per volt second at 77° K. The electron mobility remain constant as the temperature was decreased further to 4° K. As seen in FIG. 2 at curve (c), a sheet carrier density of the sample 5 is plotted as a function of temperature. In the material 8 used in sample 5, the value of X is equal to approximately 0.09, with the value of $1-x$ therefore being equal to approximately 0.91.

The dramatic increase in carrier mobility values in sample 5 may be attributed to the presence of a two dimensional electron gas at the interface between the $Al_{0.09}Ga_{0.91}N$ and the GaN layer 7. Although the conduction band discontinuity has neither been measured or calculated for sample 5, one would estimate that the conduction band discontinuity is approximately 0.25 electron volts, assuming a 60/40 split of the bandgap discontinuity similar to the $GaAs/Al_xGa_{1-x}As$ material as reported by R. L. Anderson in Vol. 5 of solid state electronics, Page 341 (1962). The carrier concentration of the $Al_{0.09}Ga_{0.91}N$ material 8, in bulk, is measured as approximately $5 \times 10^{18}$ per $cm^3$ and has an electron mobility of approximately 35 cm² per volt second.

Assuming a two dimensional gas structure, conduction must be based on contributions both from the two dimensional gas and from the bulk GaN and the $Al0.09Ga_{0.91}N$ material. Therefore, the measured electron mobilities of FIG. 2 are in essence averaged values and the actual two dimensional gas mobilities are higher than the indicated values. By using a parallel conduction model, one would estimate that the true mobility of the two dimensional electron gas at 300° K. would be 820 cm² per volt second and the sheet carrier density would be approximately $5 \times 10^{13}$ per $cm^2$.

This model may be further described by reference to FIG. 3a. The sample 10 of FIG. 3a includes a sapphire substrate 11 having a thickness of approximately 350 microns, followed by an aluminum nitride buffer layer of 12 having a thickness of approximately 50 angstroms. Deposited on layer 12 is a GaN layer 13 having a thickness of approximately 6,000 angstroms. Finally, an $Al_{0.09}Ga_{0.91}N$ layer 14 having a thickness of approximately 500 angstroms is deposited. Referring to FIG. 4, curve (b), increasing the GaN layer thickness and hence the bulk conduction reduced the room temperature mobility of the single heterojunction from 620 cm²N-s to 450 cm²N-s but had little effect on the 77K mobility which remained at 1600 cm²N-s for both samples. The increased bulk GaN conduction at room temperature causes the average value of the heterojunction mobility to be pushed closer to that for bulk GaN. At 77K, the high mobility of the interface dominates the measured mobility for both structures.

Referring now to FIG. 3b, a sample 15 having multiple heterojunctions is depicted. The substrate 16 is a 350 micron thick layer of sapphire, followed by a 50 angstrom thick aluminum nitride buffer layer 17. The GaN layer 18 is only 2,000° thick and is followed by 18 parallel conducting channels 19-36, composed of alternating layers of the $Al_{0.15}Ga_{0.85}N$ material and a GaN layer. Layer 19 would be composed of the $Al_xGa_{1-x}$ material, whereas layer 20, for example, would be composed of gallium nitride.

Referring to FIG. 7a, curve (a), the trace shows an electron mobility of 1,980 cm² per volt second with a charged density $1.5 \times 10^{14}$ per $cm^2$ at 77° K. Note the sheet charge density at FIG. 7, curve (b) increased by about a factor of ten over the case of Sample 5 depicted in FIG. 2 at curve (c).

Referring to FIGS. 5 and 6, the details of construction of a high mobility transistor based on the materials just described can be seen. The substrate material 37 may be of silicon, gallium arsenide, silicon carbide, aluminum oxide or indium phosphide. Substrate 37 is coated of a buffer layer 38, typically formed of an aluminum nitride layer having a thickness of approximately 50 angstroms. The channel region 39 of transistor 40 is a gallium nitride layer between 500 and 2,000 angstroms thick. The thickness of layer 39 is such that it can be completely depleted at a few volts applied to a shottky barrier formed on it. The gallium nitride layer 39 is coated with a thin (approximately 500 angstroms thick) $Al_xGa_{1-x}N$ layer 41. Depending on the application of the particular device 40, the aluminum composition of layer 41 may be varied. The effects of band bending to cause electrons from layer 41 to spill over to layer 39 at the interface 42 residing between them. This will create a sheet charge density of a two dimensional electron gas with mobilities several times greater than bulk material electrons.

Following epi-layer depositions just described, the device structure will be fabricated as follows. First, photomasking is used to define the source pad 43 and the drain contact pad 44. Ohmic metal contact 45 is deposited on the $Al_xGa_{1-x}N$ region 41 defined as source 43, with a similar ohmic pad 46 being deposited on drain 44.

Various metal material may serve as a the ohmic contacts 45, 46 such as gold, silver, aluminum or indium.

A shottky barrier 47 is deposited using thin metal layers in the region between source contact 43 and drain contact 44, thereby defining a gate contact 47. Several metal combinations can be used from the shottky barrier formation, such as titanium, gold, aluminum, silver, chromium, tungsten and indium. Electrical conductors 48, 49 and 50 are bonded to ohmic contacts 45 and 46 and shottky contact 47.

As may be understood by those skilled in the art, the examples just described represent a reduction to practice of highly theoretical experiments. Commercial embodiments will follow utilizing these and similar materials in ways that differ from the prototypes just described, without departing from the spirit and scope of the invention as defined by the following claims.

We claim:
1. A method of making a transistor, comprising the steps of:
   (a) depositing a buffer layer onto a substrate;

(b) depositing a layer of gallium nitride (GaN) onto the buffer layer;

(c) depositing a layer of $Al_xGa_{1-x}N$ on the gallium nitride layer, where x has a value of between 0 and 1;

(d) depositing a first metal layer onto the $Al_xGa_{1-x}N$ layer, thereby defining a source connection;

(e) depositing a second metallic layer onto the $Al_xGa_{1-x}N$ layer, thereby defining a drain region; and (f) depositing a third metal layer, onto the $Al_xGa_{1-x}N$ layer, the third metal layer, onto the $Al_xGa_{1-x}N$ layer, the third metal layer residing between the source region and the drain region, thereby defining a shottky barrier.

2. The method of making a transistor of claim 1, further comprising the steps of:

(a) connecting a first electrically conductive wire to the source region;

(b) connecting a second electrically conductive wire to the drain region; and (c) connecting a third electrically conductive wire to the shottky barrier, thereby permitting connection of the transistor to an external circuit.

3. The method of making a transistor of claim 2, wherein the metal deposited to form the shottky barrier is chosen from a group including titanium, gold, aluminum, silver, chromium, tungsten, and indium.

4. The method of making a transistor of claim 3, wherein x is chosen to be approximately equal to 0.15.

* * * * *

UNITED STATES PATENT AND TRADEMARK OFFICE
CERTIFICATE OF CORRECTION

PATENT NO. : 5,296,395
DATED : March 22, 1994
INVENTOR(S) : MUHAMMAD A. KHAN et al.

It is certified that error appears in the above-identified patent and that said Letters Patent is hereby corrected as shown below:

In column 2, line 1, for "2,00" read --2,000--.
In column 2, line 49, after "lattice" delete ",".
In column 3, line 11, after "$_xN$" insert --layer 9--.
In column 3, lines 35, 36, for "solid state electronics" read --Solid State Electronics--.
In column 3, lines 42, 43, for "A10.0-9Ga$_{0.91}$N" read --Al$_{0.09}$Ga$_{0.91}$N--.
In column 4, line 47, after "as" delete "a".
In column 5, lines 12, 13, after "layer" delete "onto the Al$_x$-Ga$_{1-x}$N layer, the third metal layer".

Signed and Sealed this

Second Day of August, 1994

Attest:

BRUCE LEHMAN

*Attesting Officer*    Commissioner of Patents and Trademarks

UNITED STATES PATENT AND TRADEMARK OFFICE
CERTIFICATE OF CORRECTION

PATENT NO.   : 5,296,395
DATED        : March 22, 1994
INVENTOR(S)  : Khan et al.

It is certified that error appears in the above-identified patent and that said Letters Patent is hereby corrected as shown below:

<u>Column 1,</u>
Line 4, please insert as the first sentence of the specification the following:

-- This invention was made with government support under Contract N00014-90-C-0146 awarded by the Office of Naval Research (ONR). The government has certain rights in the invention. --

Signed and Sealed this

Fourth Day of June, 2002

*Attest:*

JAMES E. ROGAN
*Attesting Officer*    *Director of the United States Patent and Trademark Office*